United States Patent
Kudo et al.

(10) Patent No.: US 11,843,066 B2
(45) Date of Patent: Dec. 12, 2023

(54) DECORATED PHOTOVOLTAIC CELL MODULE

(71) Applicants: Yuki Kudo, Susono (JP); Taizo Masuda, Yokohama (JP); Masahiro Kitamura, Hirakata (JP); Takakazu Hase, Hirakata (JP)

(72) Inventors: Yuki Kudo, Susono (JP); Taizo Masuda, Yokohama (JP); Masahiro Kitamura, Hirakata (JP); Takakazu Hase, Hirakata (JP)

(73) Assignees: TOYOTA JIDOSHA KABUSHIKI KAISHA, Toyota (JP); NIPPON PAINT AUTOMOTIVE COATINGS CO., LTD., Hirakata (JP)

( * ) Notice: Subject to any disclaimer, the term of this patent is extended or adjusted under 35 U.S.C. 154(b) by 0 days.

(21) Appl. No.: 16/988,263

(22) Filed: Aug. 7, 2020

(65) Prior Publication Data

US 2021/0043787 A1 Feb. 11, 2021

(30) Foreign Application Priority Data

Aug. 8, 2019 (JP) .................................. 2019-146044

(51) Int. Cl.
*H01L 31/048* (2014.01)
*H02S 20/30* (2014.01)
(Continued)

(52) U.S. Cl.
CPC ...... *H01L 31/048* (2013.01); *H01L 31/02167* (2013.01); *H02S 20/30* (2014.12); *H02S 40/22* (2014.12)

(58) Field of Classification Search
CPC ............. H01L 31/048; H01L 31/02167; H01L 31/02168; H01L 31/0481; H01L 31/054; H01L 31/0547; Y02E 10/50–56
See application file for complete search history.

(56) References Cited

U.S. PATENT DOCUMENTS 5,589,006 A * 12/1996 Itoyama .................. F24S 20/67
136/248
2006/0057392 A1 * 3/2006 Smillie ..................... B32B 7/06
428/522

(Continued)

FOREIGN PATENT DOCUMENTS

EP 2051124 A3 7/2009
JP H11315623 A 11/1999
(Continued)

OTHER PUBLICATIONS

Dictionary definition of "glitter" from Merriam-Webster retrieved from https://www.merriam-webster.com/dictionary/glitter on Jul. 8, 2021.*

(Continued)

*Primary Examiner* — Tae-Sik Kang
(74) *Attorney, Agent, or Firm* — Dinsmore & Shohl LLP

(57) ABSTRACT

A photovoltaic cell module in which a difference in color between a photovoltaic cell and the other portion is made to disappear and the changes of the color and appearance of its surface depending upon a viewing angle is hardly visually recognized, while suppressing the reduction of the power generation amount of the photovoltaic cell. The present photovoltaic cell module includes a thin plate-like photovoltaic cell enclosed in transparent sealing material; a transparent face plate laminated on the surface of the sealing (Continued)

material on the light receiving surface side of the photovoltaic cell; and a decorative layer laminated on the face plate, where a transparent resin is employed as base material of the decorative layer and light transmissive scaly glitter pigment is dispersed in the decorative layer such that the surface direction of the pigment is along the face plate surface.

12 Claims, 10 Drawing Sheets

(51) Int. Cl.
  *H02S 40/22* (2014.01)
  *H01L 31/0216* (2014.01)

(56) References Cited

U.S. PATENT DOCUMENTS

| | | | | |
|---|---|---|---|---|
| 2007/0295390 | A1* | 12/2007 | Sheats | H02S 20/23 136/251 |
| 2013/0152995 | A1* | 6/2013 | Kuromiya | H01L 31/02168 136/244 |
| 2013/0206210 | A1* | 8/2013 | Niinobe | H01L 31/056 136/246 |
| 2014/0137936 | A1* | 5/2014 | Sumino | C08J 5/18 524/545 |
| 2015/0007884 | A1 | 1/2015 | Kalkanoglu et al. | |
| 2015/0075615 | A1 | 3/2015 | Ihara | |
| 2015/0249166 | A1* | 9/2015 | Iitsuka | G02B 5/0215 136/256 |
| 2016/0218234 | A1* | 7/2016 | Balasubramanian | B44F 1/06 |
| 2019/0109248 | A1 | 4/2019 | Banerjee et al. | |
| 2020/0295705 | A1* | 9/2020 | Onozaki | H01L 31/048 |
| 2020/0317563 | A1* | 10/2020 | Sakai | C03C 17/42 |
| 2020/0335643 | A1* | 10/2020 | Hunger | H01L 31/02167 |
| 2020/0343397 | A1 | 10/2020 | Hem-Jensen | |

FOREIGN PATENT DOCUMENTS

| | | | |
|---|---|---|---|
| JP | 2007-256719 A | 10/2007 | |
| JP | 2012-195489 A | 10/2012 | |
| JP | 2013-229576 A | 11/2013 | |
| JP | 2013-258276 A | 12/2013 | |
| JP | 2014-143384 A | 8/2014 | |
| JP | 2014-165389 A | 9/2014 | |
| JP | 2016-025231 A | 2/2016 | |
| JP | 2016-207960 A | 12/2016 | |
| JP | 2017-69395 A | 4/2017 | |
| JP | 2019-102601 A | 6/2019 | |
| JP | 2020-032545 A | 3/2020 | |
| WO | 2013/105522 A1 | 7/2013 | |
| WO | 2017/090056 A1 | 6/2017 | |
| WO | 2018/158470 A1 | 9/2018 | |
| WO | 2018/180261 A1 | 10/2018 | |
| WO | WO-2019031378 A1 * | 2/2019 | |
| WO | 2019/116859 A1 | 6/2019 | |
| WO | WO-2019116858 A1 * | 6/2019 | C03C 17/007 |
| WO | WO-2019122079 A1 * | 6/2019 | H01L 31/02167 |
| WO | WO-2020096329 A1 * | 5/2020 | C09D 125/00 |
| WO | WO-2020155628 A1 * | 8/2020 | |

OTHER PUBLICATIONS

Dictionary definition of "scaly" from Merriam-Webster retrieved from https://www.merriam-webster.com/dictionary/scaly on Jul. 8, 2021.*

* cited by examiner

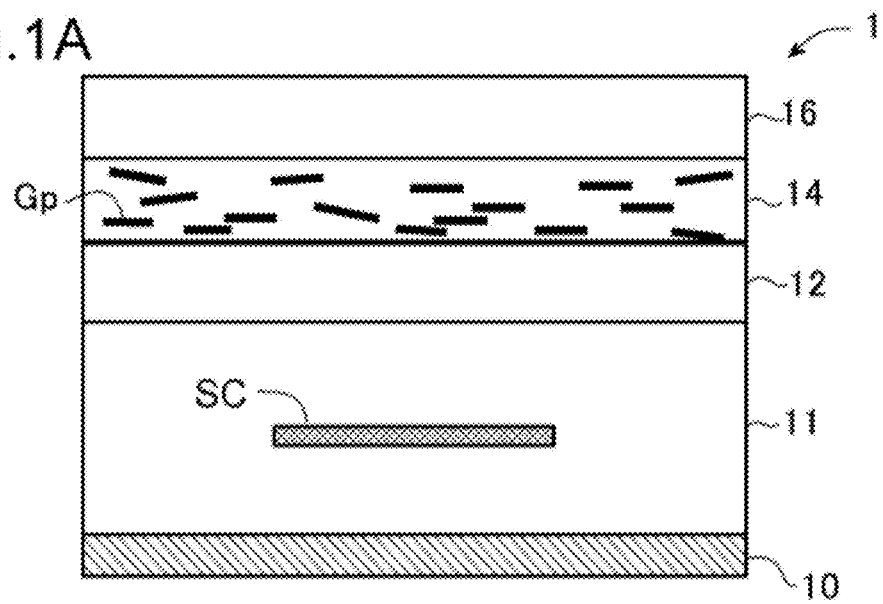
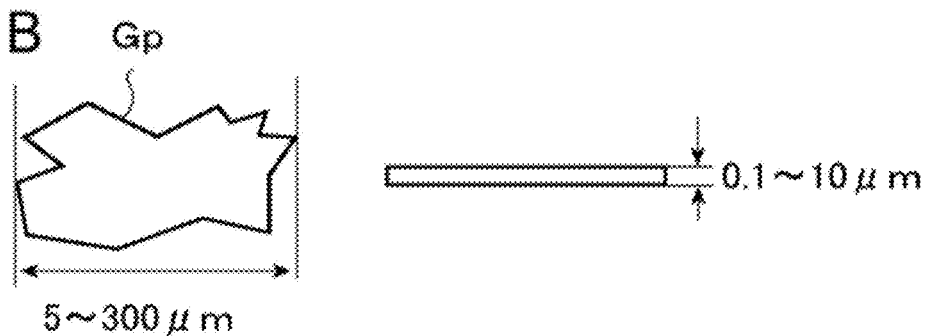

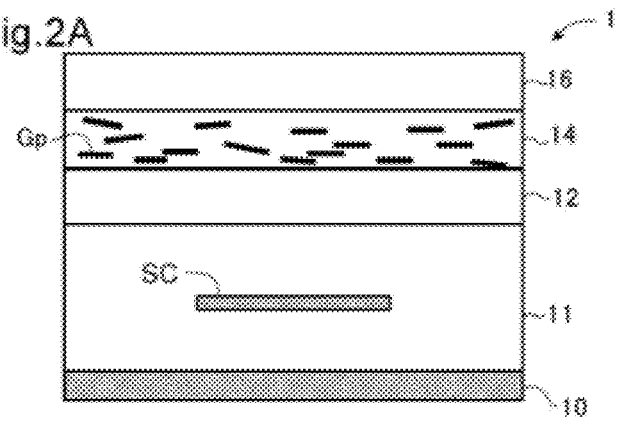
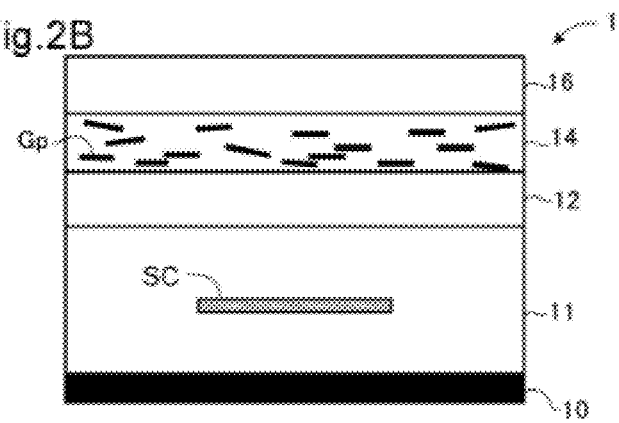
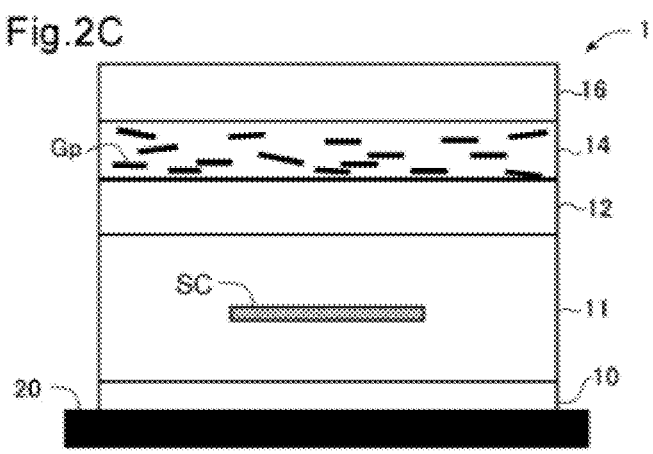

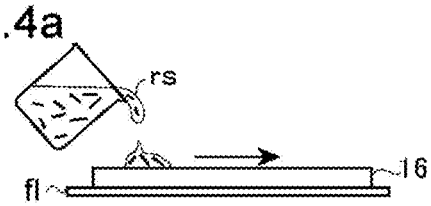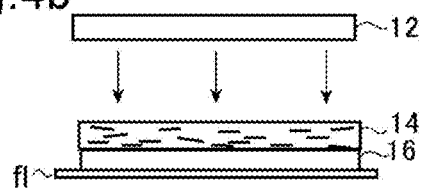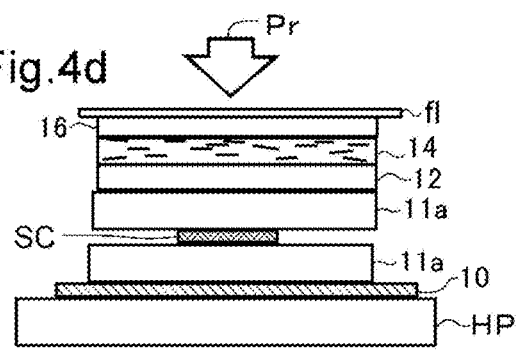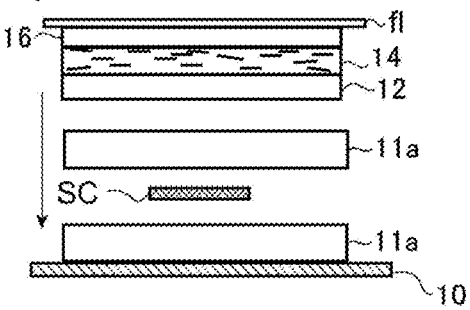

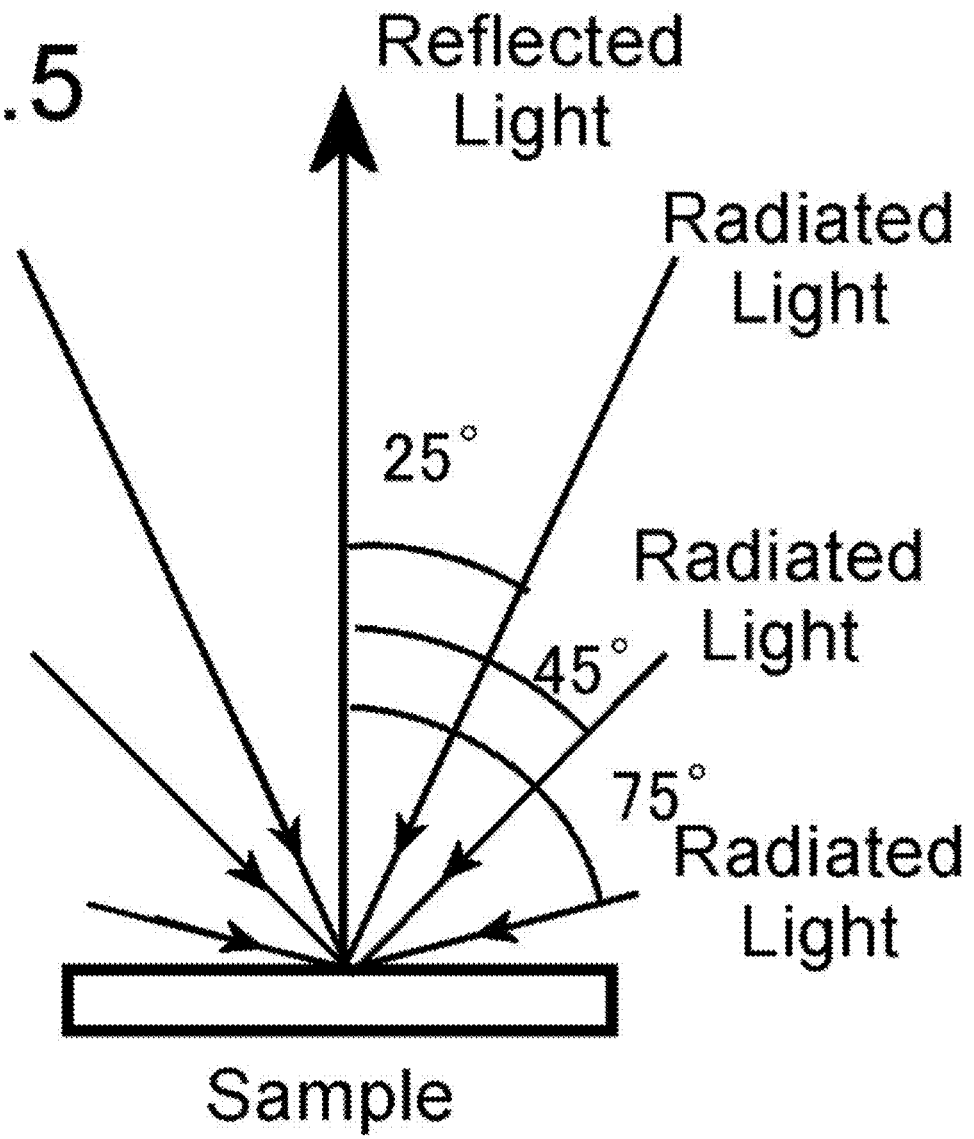

Fig.6A Decorative Layer (the Present Embodiment)
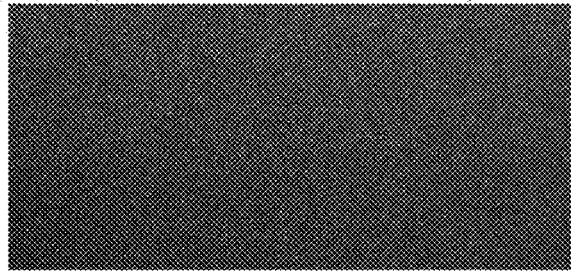
Fig.6B Decorative Layer (comparison)
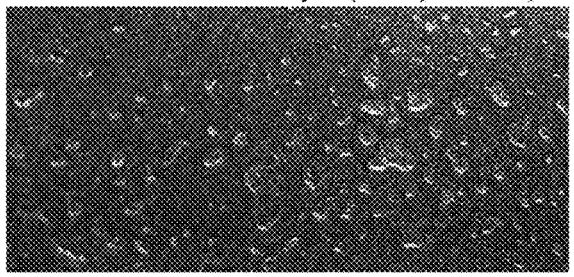
Fig.6C Decorative Layer Section
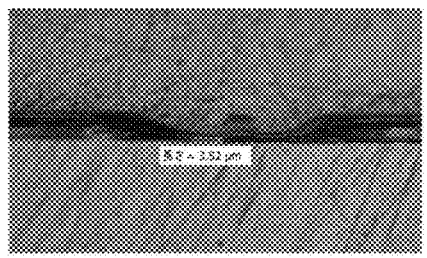

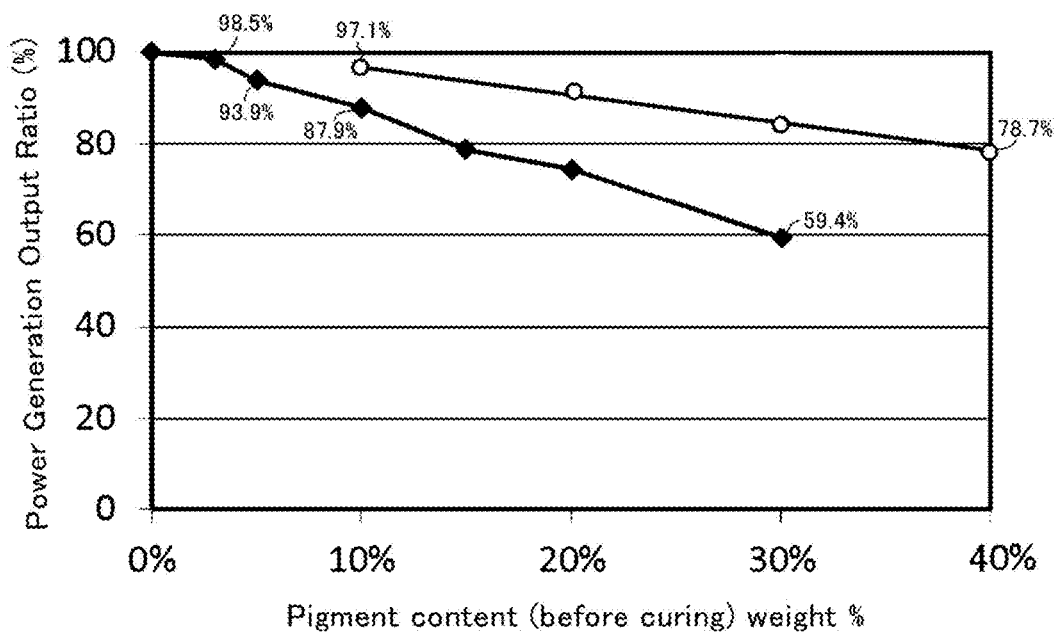

Alumina (green)

Alumina (gold)

Glass flake (silver)

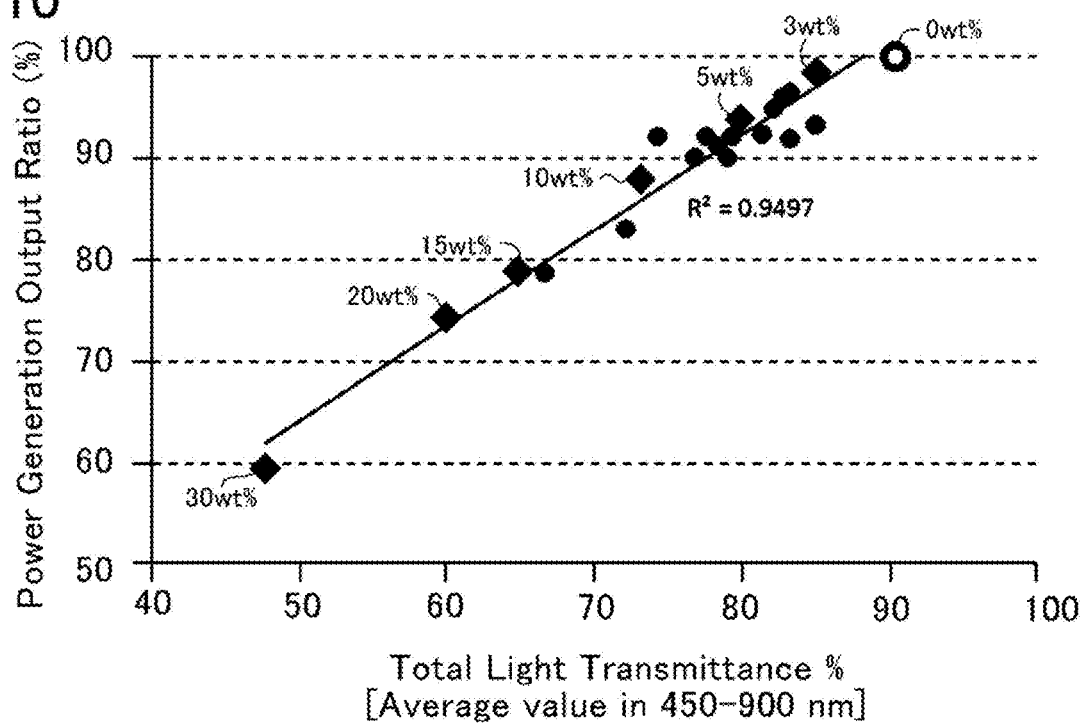

DECORATED PHOTOVOLTAIC CELL MODULE

CROSS-REFERENCE TO RELATED APPLICATION

This application claims priority to Japanese Patent Application No. 2019-146044 filed on Aug. 8, 2019, which is incorporated herein by reference in its entirety including the specification, drawings, and abstract.

TECHNICAL FIELD

The present disclosure relates to a photovoltaic cell module, and more specifically to a photovoltaic cell module which has a configuration in which a face plate covered with a decorative layer is laminated on a light receiving surface side of a photovoltaic cell.

BACKGROUND ART

Generally, the surface of a photovoltaic cell module simply exhibits black or navy blue. However, in recent years, since photovoltaic cell modules become installed in various places (on a building, a vehicle roof, a wall surface, grounds, etc.), the appearance maintenances and designabilities of locations where photovoltaic cell modules are installed are considered, and thus, the improvement in the designability of a photovoltaic cell module is being requested. Then, for instance, as shown in WO 2017/090056, it has been proposed to give an arbitrary color to the appearance of a photovoltaic cell module by forming or applying a colored coating layer (colored layer) on a surface of a sheet of glass or polymeric resin (face plate) which is laminated on the light receiving surface of a photovoltaic cell. In JP H11-315623, there is disclosed a roof module with photovoltaic cells having photovoltaic cell parts and decorative parts such that the decorative parts, provided with discriminable indications, are formed to be separable from the photovoltaic cell parts. In JP 2013-229576, there is shown a structure of a photovoltaic cell module in which a surface protection layer, a reinforcement layer, a photoelectric conversion layer and a back protecting layer are laminated in order from the sunlight receiving surface side, where the reinforcement layer consists of a partially decorated glass or extended polyester resin sheet and is decorated in an electric wire circuit pattern on the photoelectric conversion layer which exists on the sunlight receiving surface so that the occurrence of a glaring phenomenon on the surface of the photovoltaic cell module by reflection of the sunlight on metal electric wires will be suppressed. In JP 2013-258276, there is disclosed a structure of a back sheet for a photovoltaic cell comprising a laminated body formed by laminating two films on the opposite sides of a hot-melt adhesive layer, where, from the light receiving surface side of the cell, glass/sealing material/cell/sealing material/back sheet are assembled into a structure, and, in a condition that a sheet for decoration is laid on the back sheet, the structure is integrally molded with a vacuum laminator so that the thickness of the back sheet will decrease thinner than the sheet for decoration, and thereby on the back sheet outer surface, concave portions are formed so that decoration will be provided. In JP 2014-165389, there is disclosed a structure of a light transmission type photovoltaic cell module in which a weatherable protection member, two or more photovoltaic cell elements and a photovoltaic cell back sheet are laminated in order from the light incident side, wherein the back sheet has at least two plastic films clamping an adhesive layer which is made of a hot melt resin composite containing 100 weight part of polyolefin hot melt resin obtained by denaturing it by a polar vinyl compound and 0.0001 to 20 weight part of one or more kinds of colorant chosen from a group of pigments and dyes, and the adhesive layer is decorated with uneven structure which consists of characters and figures physically applied on the installation surface of the photovoltaic cell back sheet, so that its lighting property and designability, such as colors, characters, figures and unevenness shapes, will be improved. JP 2016-207960 discloses a structure of a solar panel having a substrate, two or more solar cells sealed with transparent sealing material and a protective film, where the protective film is formed by heat-fusing a coloring part made of synthetic resin material containing colorant to a transparent sheet made of transparent synthetic resin material while the coloring part is arranged so that bus bars and interconnector, connected to two or more solar cells, will be covered in the protective film, and thereby it is prevented that the bus bars and interconnectors are seen from the light receiving surface side and those glare by light reflection is prevented also, and its designability will be obtained. Further, JP 2017-69395 discloses an organic thin film photovoltaic cell module which has a light transmissive organic thin film photovoltaic cell element; sealing layers applied on the opposite sides thereof, respectively; gas barrier films applied on the respective surfaces of the other sides of the sealing layers; and a plurality of gas barrier layers on the respective sides, which layers are laminated with adhesion layers containing urethane adhesive, where the organic thin film photovoltaic cell element is further equipped with spacer layers on the opposite end face sides in the longitudinal direction in a plan view, respectively, and a transparent film and a decorative layer applied on the surface of one side of the transparent film and decorated in the same color as the photovoltaic cell element are provided; the end face of the cell element is in contact with the end face of the spacer layer; the opposite end faces of the cell element are fixed by tape of the same color as that of the decorative layer and organic thin film photovoltaic cell element or by transparent tape; and the tape is applied over the surface of the organic thin film photovoltaic cell element and the surface of the spacer layer.

SUMMARY

Generally, a photovoltaic cell module has a configuration that a planar photovoltaic cell or photoelectric conversion element sealed with sealing material is placed on a flat substrate so that its surface direction of the former will be along the surface direction of the latter. In this configuration, the color of the photovoltaic cell or photoelectric conversion element is very different from that of the other portion, and thus, in order to make the difference in color disappear and improve the designability of a photovoltaic cell module, only the prevention of glaring due to light reflection on metal wiring portions of the photovoltaic cell or photoelectric conversion element or partial decoration thereof as shown in the documents listed above (for example, JP H11-315623, JP 2013-229576, and JP 2016-207960, etc.) is insufficient, and the whole surface of a photovoltaic cell module may be made to look almost uniform by applying on the almost whole region of the surface of the photovoltaic cell module, a colored layer or a decorative layer which is colored by adding or dispersing colorant, glitter pigment or glitter material therein. In this respect, in a photovoltaic cell module, in order to achieve a sufficient power generation amount in a photovoltaic cell or a photoelectric conversion element, a colored layer or a decorative layer laminated on the light receiving surface of the photovoltaic cell or photoelectric conversion element has a sufficient light transmittance, and therefore, the added amount or dispersed amount of colorant, glitter pigment or glitter material in the colored layer or decorative layer is as small as possible. However, if the added amount or dispersed amount is too small, the difference in color between the photovoltaic cell or photoelectric conversion element and the other portions cannot fully be made disappear in the appearance, and thus, the purpose of improving the designability of the photovoltaic cell module will not be achieved. Further, although, in prior art, in order to obtain a colored layer or a decorative layer being colored so that color can be seen in the appearance while its sufficient light transmittance is ensured, a layer which reflects a selectively specific wavelength range is formed with pigment, such as SiOx, TiOx, etc. which cause light interference uniformly on a surface, such a colored layer or such a decorative layer employs a light interferential effect, resulting in the increase of an angular dependency on the wavelength of reflected light, and therefore, its color varies unnaturally depending upon a viewing angle and a specific appearance cannot be obtained, and thus, it is difficult to obtain suitable texture, for example, in a case that a photovoltaic cell module is applied to the exterior of a vehicle, such as a car. Moreover, the output required in a photovoltaic cell module varies, depending upon its use or purpose: for instance, even a photovoltaic cell module with a nearly zero output may be used when it is installed in a museum or an art museum, while, in order to substantially realize ZEH (zero energy house) and ZEB (zero energy building), in some embodiments, 60% or more of the output of a case without decoration can be obtained.

By the way, in the research and development for improvement in the designability of photovoltaic cell modules by the inventors of the present disclosure, it has been found that, when a flat-shaped, scaly glitter pigment with a light transmissive property (light transmissive scaly glitter pigment) having the feature explained in detail later is used at a comparatively small pigment amount as a pigment for coloring dispersed in a decorative layer laminated on the surface of a photovoltaic cell module such that the surface direction of the scaly glitter pigment is made oriented along the extending direction (the surface direction) of the decorative layer, namely, in almost parallel to the extending direction of the layer, the difference in color between the photovoltaic cell or photoelectric conversion element and the other portions disappears and also the changes of the color and appearance of the surface depending upon a viewing angle are hardly observed while it becomes possible to suppress at a very low degree the reduction of the power generation efficiency of the photovoltaic cell or photoelectric conversion element. Further, it is also possible to variously select the color of the surface of a photovoltaic cell module by choosing the kind of scaly glitter pigment dispersed in the decorative layer. These knowledges are used in the present embodiment.

Thus, one of objects of the present disclosure is to provide a photovoltaic cell module whose surface is decorated, where the designability is improved such that the difference in color between a photovoltaic cell or a photoelectric conversion element and the other portion has disappeared and the changes of the color and appearance of the surface depending upon a viewing angle are hardly observed, while it becomes possible to suppress very low the reduction of the power generation efficiency of the photovoltaic cell or photoelectric conversion element.

According to one embodiment, the above-mentioned object is achieved by a photovoltaic cell module, comprising:
 a thin plate-like photovoltaic cell enclosed in a transparent sealing material;
 a transparent face plate laminated and adhered on a surface of the sealing material on a light receiving surface side of the photovoltaic cell; and
 a decorative layer laminated and adhered on the face plate,
 wherein a transparent resin is employed for base material of the decorative layer and a scaly glitter pigment having a light transmissive property is dispersed in the decorative layer such that a surface direction of the scaly glitter pigment is oriented along a surface of the face plate.

In the structure of the above-mentioned embodiment, "a thin plate-like photovoltaic cell" may be a photoelectric conversion element of such as crystal or amorphous silicon, thin membranous silicon, perovskite series, chalcopyrite series, III-V group series, CdTe, CIS, etc., formed in a thin plate shape. The color of the photovoltaic cell itself is usually black and dark blue or colorless transparent. The opposite sides and circumference of the photovoltaic cell are covered with the transparent sealing material made of such as ethylene vinyl acetate (EVA), polyvinyl butyral (PVB), polyolefin resin, ionomer resin, silicon resin, etc. (thereby, the photovoltaic cell is enclosed in the sealing material), and further, the "face plate" typically made of transparent material, such as polycarbonate resin, acrylic resin, glass plate, as noted above is laminated and adhered on the light receiving surface side of the photovoltaic cell. Then, in the case of the present embodiment, on the outer surface of the face plate (the surface on the side opposite to the side facing the photovoltaic cell), the decorative layer comprising the transparent resin, such as urethane resin, polycarbonate-containing urethane resin, vinyl chloride-vinyl acetate-containing urethane resin, acrylic resin, polyester resin, polyolefin resin, etc., as the base material, within which layer the "scaly glitter pigment" with a light transmissive property (light transmissive scaly glitter pigment) is dispersed in a condition that the surface direction of the pigment is oriented along the surface of the face plate, namely, in almost parallel to the surface of the face plate. Here, the "scaly glitter pigment having a light transmissive property" is a pigment which has a light transmissive property as well as a pearl-like or metal-like gloss or luster, and especially their respective particles have a flat thin piece shape. Concretely, the scaly glitter pigment may be interference alumina flake, interference mica flake, interference glass flake, interference silica flake, interference talc flake, etc., and it may be pigment of flat thin particles whose size in the surface direction is about 5-300 μm and whose thickness is about 0.1-10 μm.

As in the above-mentioned structure, in a photovoltaic cell module, when the decorative layer in which the light transmissive scaly glitter pigment is oriented along or in almost parallel to the surface of the face plate is laminated on the face plate laminated on the surface of the sealing material encapsulating the thin plate photovoltaic cell, it becomes possible to make the difference in color between the photovoltaic cell or photoelectric conversion element and the other portions disappear and achieve a condition that almost no changes of the color and appearance depending upon a viewing angle are recognized in the observation of the decorative layer from its outside, while suppressing very low the reduction of the power generation amount of the photovoltaic cell owing that the decorative layer is applied thereon. The reason for this is considered that, according to the manner that the light transmissive scaly glitter pigment is dispersed in a decorative layer such that its particles are oriented along the surface of the face plate, each particle of the scaly glitter pigment can cover a larger area on the surface of the face plate so that the pigment amount for covering the whole region of the face plate to achieve the improvement of the designability of the photovoltaic cell module as above can be smaller, and thereby a sufficient light transmissive property to a photovoltaic cell will be ensured even when the decorative layer is laminated. In this regard, in the above-mentioned structure, in order to obtain a better designability of the appearance of a photovoltaic cell module and also suppress the reduction of the power generation amount of a photovoltaic cell lower, more concretely, the thickness of the film-like decorative layer may be 3-70 μm, in some embodiments, 5-50 μm, and in other embodiments, 10-30 μm, and the content of the scaly glitter pigment in a decorative layer before its curing may be 3-40 weight %, and, in some embodiments, the decorative layer may be formed such that the average value of the total light transmittance in the wavelength range from 450 nm to 900 nm will be about 50% or more, in some embodiments, about 60% or more, and in other embodiments 70%-85%.

Further, in the above-mentioned structure, in order to protect the decorative layer, there may be laminated a hard coat layer or a clear layer on the upper surface (the surface opposite to the face plate side) of the decorative layer. The thickness of the hard coat layer or clear layer may be 5-50 μm, in some embodiments 10-40 μm, and in other embodiments 15-30 μm. The hard coat layer or clear layer may be the same as that applied to a coated surface of a vehicle, etc., and especially it may be a transparent layer composed of an active energy ray curable type coating composite. In this regard, between the decorative layer and the hard coat layer or clear layers, there may be interposed a printed layer in which an arbitrary pattern can be printed at a degree to which the total light transmittance is not largely reduced. In order to adhere this printed layer to the hard coat layer or clear layer, there may be applied an adhering layer (an adhesive layer), in which arbitrary paint may be contained. Furthermore, the photovoltaic cell module of the present embodiment may be applied on a curved surface or an arbitrary solid geometrical surface, such as on a molded polycarbonate plate, etc., and in that case, the decorative layer and the respective layers laminated thereon may be stretchable so as to be suited on the curved surface or arbitrary solid geometrical surface.

Moreover, for the purpose of improving the designability of the photovoltaic cell module, on the surface of the sealing material on the side opposite to the light receiving surface of a photovoltaic cell (below the photovoltaic cell), there may be applied a back plane member in various manners. For instance, under the photovoltaic cell, there may be laminated a back plane member which exhibits the substantially same color as the light receiving surface of the photovoltaic cell or a back plane member which exhibits black, and in those cases, it becomes possible to make the difference in color between the photovoltaic cell and the other portions more suitably disappear in the appearance of the photovoltaic cell module. Or, there may be laminated a transparent back plane member under the photovoltaic cell such that the back plane member is flush on an installation mount exhibiting the substantially same color as the light receiving surface of the photovoltaic cell or black, and thereby it becomes possible to make the difference in color between the photovoltaic cell and the other portions more suitably disappear. In this regard, the similar effect may be achieved by interposing a film layer exhibiting the substantially same color as the light receiving surface of the photovoltaic cell between the back surface on the side opposite to the light receiving surface side of the photovoltaic cell and the surfaces of the sealing material.

Furthermore, for the purpose of improving the designability of the photovoltaic cell module, on the surface of the sealing material on the side opposite to the light receiving surface of the photovoltaic cell, there may be laminated a back plane member which exhibits a different color from the light receiving surface of the photovoltaic cell. In this case, there will be provided on the photovoltaic cell an ornament whose colors vary between the photovoltaic cell and the other portions (the effect that the color and appearance of the surface hardly vary depending upon its viewing angle can also be acquired).

By the way, generally, the application of a decorative layer to a surface of a vehicle body, etc. is achieved by attaching and curing the decorative layer on the surface. On the other hand, in the process of preparing a photovoltaic cell module as described above, typically, in order to sealing a photovoltaic cell in sealing material, there is performed a heat press process in which, in the condition that resin material to be used as the sealing material (resin material for sealing) and a photovoltaic cell are sandwiched between the face plate and the back plane member, the heating to the cross-linking temperature of the resin material for sealing is conducted while the face plate and back plane member are pressurized from the opposite sides. Thus, in one typical manner of a case of preparing a photovoltaic cell module whose surface is decorated, the face plate on which a decorative layer has been laminated and adhered may be used in the above-mentioned heat press process. In this respect, according to the research of the inventors of the present disclosure (see the below-mentioned experimental examples), in the case of a photovoltaic cell module whose surface has been decorated, it has been found that, since not only a process of simply curing a decorative layer but also the heat press process as mentioned above are conducted, a uniform appearance may be acquired in the prepared photovoltaic cell module when a transparent resin used as base material of the decorative layer maintains a layer structure during the above-mentioned heat press processes (On the other hand, it has been found that, when the base material resin of the decorative layer is softened or melted in the heat press process, uneven structures are formed on the decorative layer containing the scaly glitter pigment and its appearance becomes non-uniform.). Thus, from this knowledge, in a photovoltaic cell module of the present embodiment, a resin which maintains a layer structure in the heat press process for enclosing a photovoltaic cell in the sealing material may be chosen as the transparent resin to be used as the base material of the decorative layer. Concretely, for the transparent resin to be used as the base material of the decorative layer, resins can be used, such as urethane resin (not limited thereto), characterized by having a softening temperature which is higher than the temperature to which the decorative layer reaches during the heat press process.

Thus, in the above-mentioned present embodiment, as the pigment dispersed in a decorative layer applied on a photovoltaic cell module for improving its designability, a light transmissive scaly glitter pigment is used in a condition that the scaly glitter pigment is oriented in the decorative layer along the surface of a face plate, and thereby it becomes possible to achieve the improvement of the designability in which the difference in color between the photovoltaic cell and the other portions is made disappear while the changes in color and appearance of the surface depending upon a viewing angle can hardly be visibly recognized at the smallest possible amount of the pigment, so that it also becomes possible to suppress as small as possible the reduction of the power generation amount of a photovoltaic cell or a photoelectric conversion element due to the addition of the decorative layer. Especially, as shown in detail in the embodiments described later, in a structure where a decorative layer is laminated on a photovoltaic cell module according to the teaching of the present embodiment, it becomes also possible to realize a module whose available power generation output exceeds beyond 90% of that in a case that no decorative layer is applied in a condition that the changes in color and appearance of the surface depending upon a viewing angle can hardly be visibly recognized. Then, according to the structure of the present embodiment improving the designability or beautiful appearance of a photovoltaic cell module without largely reducing its power generation output, it is expected that photovoltaic cell modules are installed in much wider areas than ever before, such as on body surfaces of vehicle, e.g. a car, etc., various curved plates or 3D shapes.

Other purposes of the present disclosures will become clear by explanations of the following embodiments of the present disclosure.

BRIEF DESCRIPTIONS OF DRAWINGS

FIG. 1A is a schematic side sectional view of one embodiment of a photovoltaic cell module according to the present disclosure.

FIG. 1B is a schematic drawing of a scaly glitter pigment (particle) dispersed in a decorative layer of a photovoltaic cell module according to the present disclosure.

FIG. 2A is a schematic side sectional view of an embodiment of a photovoltaic cell according to the present disclosure.

FIG. 2B is a schematic side sectional view of an embodiment of a photovoltaic cell according to the present disclosure.

FIG. 2C is a schematic side sectional view of an embodiment of a photovoltaic cell according to the present disclosure.

FIG. 4a is a schematic drawing of a first stage in the preparation processes of a photovoltaic cell module according to the present disclosure.

FIG. 4b is a schematic drawing of a second stage in the preparation processes of a photovoltaic cell module according to the present disclosure.

FIG. 4c is a schematic drawing of a third stage in the preparation processes of a photovoltaic cell module according to the present disclosure.

FIG. 4d is a schematic drawing of a fourth stage in the preparation processes of a photovoltaic cell module according to the present disclosure.

FIG. 5 shows optical paths in measuring color values in a colorimeter used for evaluation of the appearances of photovoltaic cell modules.

FIG. 6A shows a photograph of the surface of a photovoltaic cell module where the resin which maintains a layer structure during a heat press process was used as the base material of a decorative layer according to the teaching of the present disclosure.

FIG. 6B shows a photograph of the surface of a photovoltaic cell module where the resin which cannot maintain a layer structure during a heat press process was used as the base material of a decorative layer.

FIG. 6C shows an optical microscope image (×10) of a section of the photovoltaic cell module in FIG. 6B, showing that a concave portion was formed in the decorative layer.

FIG. 7 shows variations of power generation output ratios of photovoltaic cell modules to the contents of the scaly glitter pigments dispersed in decorative layers according to the present disclosure. ♦ indicates cases where blue alumina flake pigment was used as the light transmissive scaly glitter pigment; ○ indicates cases where green interference glass flake pigment was used as the light transmissive scaly glitter pigment.

Figure 8A:
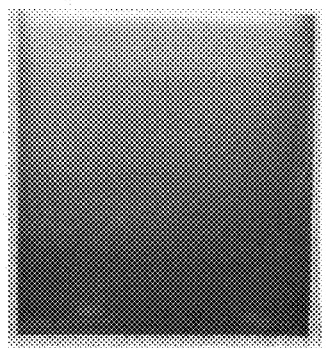

FIG. 8a shows a photograph of a photovoltaic cell module decorated in green, seen from the above, which module was prepared according to the teaching of the present disclosure.

Figure 8B:
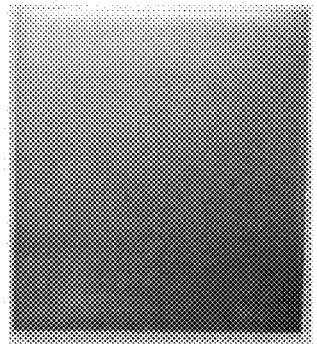

FIG. 8b shows a photograph of a photovoltaic cell module decorated in gold, seen from the above, which module was prepared according to the teaching of the present disclosure.

Figure 8C:
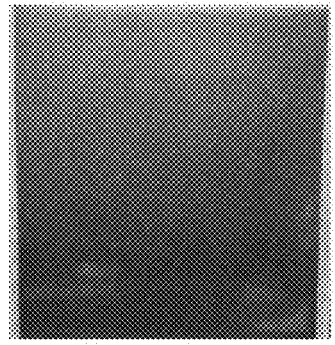

FIG. 8c shows a photograph of a photovoltaic cell module decorated in silver, seen from the above, which module was prepared according to the teaching of the present disclosure.

Figure 9A:
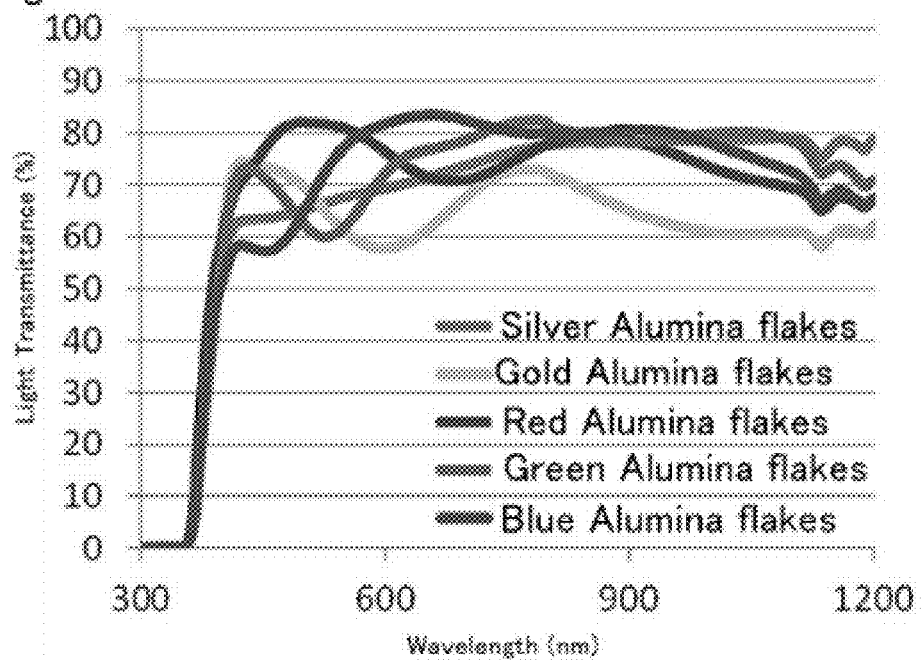

FIG. 9A shows total light transmittances of decorative layers in cases of using various alumina flakes in the decorative layers of photovoltaic cell modules according to the teaching of the present disclosure.

Figure 9B:
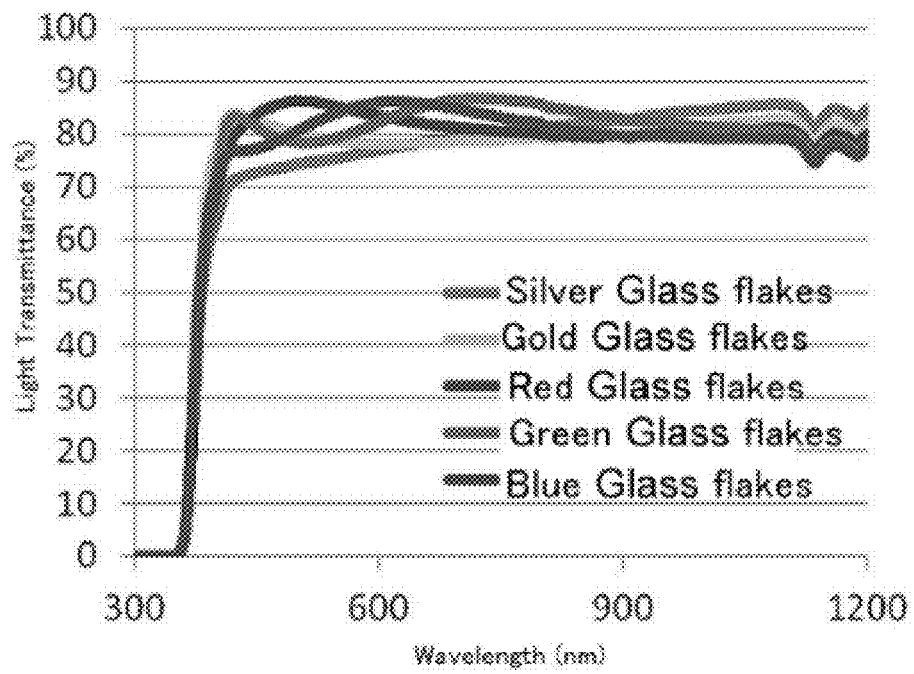

FIG. 9B shows total light transmittances of decorative layers in cases of using various interference glass flakes in the decorative layers of photovoltaic cell modules according to the teaching of the present disclosure.

FIG. 10 shows variations of power generation output ratios of photovoltaic cell modules using various light transmissive scaly glitter pigments to total light transmittances of decorative layers. ♦ indicates the cases of containing the blue alumina pigment at the depicted contents before the curing of decorative layers described in Table 1. ● indicates the cases of containing various light transmissive scaly glitter pigments listed in Table 2 at 10 weight % of the content before the curing of decorative layers. ○ indicates the case where no pigment was contained in a decorative layer.

DETAILED DESCRIPTION OF EMBODIMENTS

In the following, embodiments of the present disclosure are described in detail. In the drawings, the same references indicate the same sites.

Structure of Photovoltaic Cell Module

As already noted, since, generally, the surface of a photovoltaic cell embedded in a photovoltaic cell module simply exhibits black or navy blue, there have been conducted various trials of coloring the appearance of the photovoltaic cell module for the purpose of improving its designability, and in the present embodiment, as explained in detail below, a decorative layer is applied on the surface of a photovoltaic cell module in a manner that the reduction of the power generation amount of a photovoltaic cell is suppressed very low while the designability is improved such that the difference in color between the photovoltaic cell portion and the other portions in the appearance of the photovoltaic cell module can be made disappear and also the changes of the color and appearance of its surface depending upon a viewing angle can hardly be visibly recognized.

Referring to FIG. 1A, typically, a photovoltaic cell module 1 according to the present embodiment has a structure in which a photovoltaic cell SC having a thin plate form is enclosed in a sealing material layer 11 on a back plane member 10 with the light receiving surface of the photovoltaic cell SC being faced upward, and, in order to protect the photovoltaic cell SC, a face plate 12 is laminated and adhered on the light receiving surface side of the photovoltaic cell SC, while, in order to conduct the coloring of the photovoltaic cell module 1, a decorative layer 14 is further laminated on the face plate 12. Furthermore, a hard coat layer 16 (also called as a clear layer) may be laminated on the decorative layer 14.

In this structure, the photovoltaic cell SC may be a photoelectric conversion element of such as crystal or amorphous silicon, thin silicon, perovskite series, chalcopyrite series, III-V group series, CdTe, CIS, etc. which is formed in a thin plate of a thickness of about 0.2 mm and absorbs mainly the light in the wavelength region of the visible light to generate electric power. The sealing material layer 11, which may be made of transparent material, such as ethylene vinyl acetate (EVA), polyvinyl butyral (PVB), polyolefin resin, ionomer resin, silicon resin, etc., may be formed in a layer of a thickness of about 1 mm while surrounding the photovoltaic cell SC as illustrated in the drawing. The back plane member 10 may be formed in a layer, a film or a board with such as PET (polyethylene terephthalate), polycarbonate resin, acrylic resin, glass, metal (aluminum, etc.), etc. The face plate 12 may be a plate member of a thickness of about 3 mm, made of transparent material, such as polycarbonate resin, acrylic resin, glass, etc. The face plate 12 and the back plane member 10 each may be adhered to the sealing material layer 11 by the adhesive force of the sealing material layer 11.

Then, the decorative layer 14 laminated on the upper surface (the surface of the side opposite to the side of the sealing material layer 11) of the face plate 12 may be a layer or a membrane formed of transparent resin in which light transmissive scaly glitter pigment particles Gp are dispersed. For the transparent resin used as the base material of this decorative layer 14, there may be employed urethane resin, polycarbonate-containing urethane resin, vinyl chloride-vinyl acetate-containing urethane resin, acrylic resin, polyester resin, polyolefin resin, etc. Moreover, in order to further strengthen the adhesion between the decorative layer 14 and the face plate 12, an adhesion layer may be applied between the decorative layer 14 and the face plate 12. For the adhesion layer, isocyanate series adhesive can be used while epoxy series, amino series, ureide group, and mercapto series adhesives can also be used. When the face plate 12 is made of glass, there can conveniently be used various coupling agents, acrylic resin, various adhesive acrylic films and acrylic sheets. In this regard, as explained later, when the face plate 12 on which the decorative layer 14 is laminated is used, in order for the decorative layer 14 to maintain a layer structure without softening or melting during a heat press process performed for enclosing a photovoltaic cell SC in the sealing material, a resin such as urethane resin, etc. whose softening temperature is relatively high so that its layer structure will be maintained during the heat press process may be employed for the transparent resin used as the base material of the decorative layer 14. The thickness of the decorative layer 14 may be 3-70 μm, in some embodiments, 5-50 μm, and in other embodiments 10-30 μm. The scaly glitter pigment dispersed in the decorative layer 14 is a pigment having a light transmissive property, of which particles are thin flat-shaped pieces as schematically drawn in FIG. 1B, with a size in its surface direction of about 5 μm-about 300 μm and a thickness of about 0.1-about 10 μm. For the scaly glitter pigment in the present embodiment, concretely, for example, interference alumina flakes, interference mica flakes, interference glass flakes, interference silica flakes, interference talc flakes, etc. are employable. As schematically drawn in FIG. 1A, the scaly glitter pigment particles Gp are dispersed within the decorative layer 14 such that the surface directions of the particles are oriented along the surface of the face plate, namely, in almost parallel to the surface of the face plate (The orientation of the scaly glitter pigment Gp can be achieved by, for example, a method of forming the decorative layer as explained later.). Thereby, each particle Gp of the scaly glitter pigment can cover a larger area on the surface of the face plate so that the whole region of the surface of the face plate can be covered at a smaller pigment amount, and then, it becomes possible to reduce or dissolve the difference in appearance between the region on which a photovoltaic cell is placed and the other regions under the face plate while providing a color to the appearance of the photovoltaic cell module (The kind of color can be variously chosen by changing the kind of scaly glitter pigment.). And also in this manner, as illustrated later, because the used pigment amount becomes smaller, it becomes possible to suppress low the reduction of the power generation amount from the amount in the case that no decorative layer is laminated (When the content of the scaly glitter pigment before the curing of a decorative layer is 3 weight % to 40 weight %, about 98% to 60% of the power generation amount in the case without laminated decorative layer is obtained.). Further, it has been found that, when the scaly glitter pigment particles Gp are oriented in the decorative layer 14 as noted above, the change in color in the appearance of a photovoltaic cell module owing to its observing angle change is rarely visibly recognized as shown later. In this connection, according to the experiments by the inventors of the present disclosure, as mentioned later, it has been confirmed that, when a pigment which does not allow the light penetration therethrough (non-light transmissive pigment), such as those made of aluminum, etc. was used as the pigment dispersed in the decorative layer, although the effect that the change in color in the appearance of a photovoltaic cell module owing to its observing angle change was rarely visibly recognized was obtained, its power generation amount decreased largely.

In the structure of the above-mentioned present embodiment, for the purpose of protecting the decorative layer, a hard coat layer may be laminated on the decorative layer 14. The hard coat layer may be, for example, the same as those applied on a coated surface of a vehicle, etc. The thickness of the hard coat layer may be 5-50 μm, in some embodiments 10-40 μm, and in other embodiments 15-30 μm. As the material of the hard coat layer, an active energy ray curable type coating composite hardened by ultraviolet ray irradiation, etc. may be employed.

Thus, in the photovoltaic cell module of the above-mentioned present embodiment, since there is provided a layer structure similar to that in the paint of a car, texture with depth feeling similar to an exterior of a vehicle such as a car can be given. Furthermore, since coloring is based on the scattering effect of the light of the scaly glitter pigment (not interference of the light), the surface of the photovoltaic cell module looks uniform.

Modifications of Structures of Photovoltaic Cell Modules

Figure 3A:
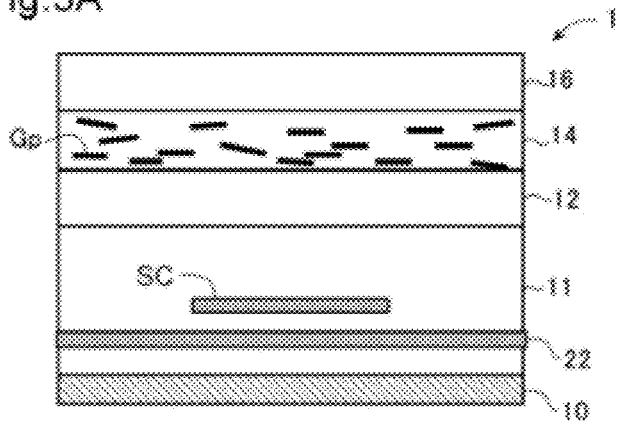
FIG. 3A is a schematic side sectional view of an embodiment of a photovoltaic cell module according to the present disclosure.
Figure 3B:
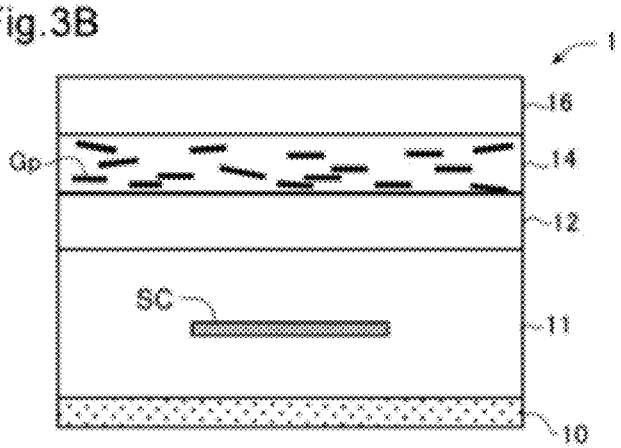
FIG. 3B is a schematic side sectional view of an embodiment of a photovoltaic cell module according to the present disclosure.
Figure 3C:
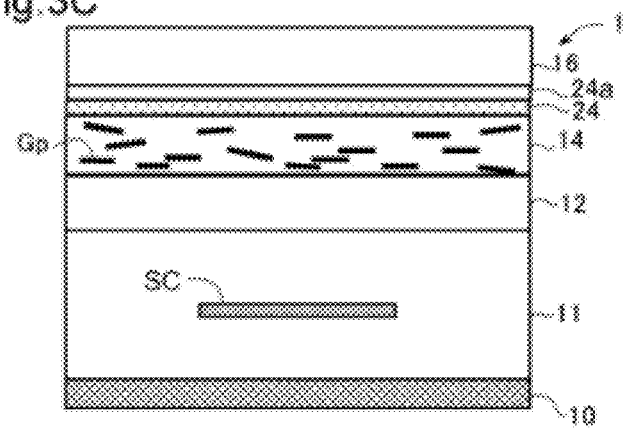
FIG. 3C is a schematic side sectional view of an embodiment of a photovoltaic cell module according to the present disclosure.

The structure of the above-mentioned photovoltaic cell module may be realized in various manners as shown below. First, as the back plane member 10, there may be employed a plate exhibiting the same color as a photovoltaic cell SC or electric wire (not shown) between photovoltaic cells, or black, as shown in FIGS. 2A and 2B, respectively. In this case, in the appearance of the photovoltaic cell module, it becomes possible to increase the uniformity in color between the region occupied by the photovoltaic cell, and the other regions. The operational effect similar to this may also be obtained by employing a transparent back plane member 10 and a black installation mount 20 for the photovoltaic cell module as shown in FIG. 2C, or by interposing a film 22 of the same color as the photovoltaic cell SC under the photovoltaic cell SC in the sealing material layer 11 as in FIG. 3A. Or, as in FIG. 3B, there may be intentionally employed a back plane member 10 of an arbitrary color different from the color of the photovoltaic cell SC (for example, the portion of the photovoltaic cell may be colored blue while the other portions may be colored green), so that the module may be designed into the combination of specific colors. Moreover, as in FIG. 3C, between the decorative layer 14 and the hard coat layers 16, there may be laminated a printed layer 24 on which an arbitrary pattern may be drawn at a degree not to greatly reduce the total light transmittance of the module, and thereby an arbitrary design can be provided in the appearance of the photovoltaic cell module. In that case, an adhesive layer 24a may be laminated on the printed layer 24 for adhesion between the printed layer 24 and the hard coat layer 16. In this regard, a pigment of an arbitrary color may be dispersed also in the adhesive layer 24a.

Preparation of Photovoltaic Cell Module

In the preparation of a photovoltaic cell module having a decorated surface as described above, first, a decorative layer 14 in which the light transmissive scaly glitter pigment is dispersed may be formed by applying on a hard coat layer or a face plate a solution of transparent resin as listed above in which the scaly glitter pigment is dispersed while spreading the solution into the film form with an arbitrary coater (for example, a die coater), and curing it in that condition. In this process, because of the shearing action in the spreading of the resin solution into the film form, the surface direction of the scaly glitter pigment particles is made oriented along the surface direction of the film. The content of the scaly glitter pigment in the resin solution for the decorative layer may be chosen appropriately, for example, in the range of 3 to 40 weight %. As understood from the experimental examples later, if the pigment amount is too small, the uniformity of the color in the appearance of a finished module is reduced while if the pigment amount is too large, the light transmittance in the module is reduced so that its power generation amount will also be reduced.

Referring to FIGS. 4a-4d, in a concrete process of forming a decorative layer, for example, a paint solution for a hard coat layer is spread on an arbitrary film-like substrate fl with a Baker type applicator so that its membrane thickness when it is dried (dry film thickness) will be 5-50 μm, and by drying it for 15 minutes at 110° C., a hard coat layer 16 is formed. Then, as in FIG. 4a, a pigment solution rs for a decorative layer in which scaly glitter pigment is dispersed is spread (as indicated by the arrow) and applied on the hard coat layer 16 with a Baker type applicator so that its dry film thickness will be a predetermined value (for example, 3-70 μm), and by drying it for 15 minutes at 110° C., a decorative layer 14 may be formed. After this, as in FIG. 4b, a face plate 12 is adhered to the decorative layer 14 by laminating the former with, for example, a heat rubber roll heated at 160° C.

As noted above, when the decorative layer 14 has been laminated on the face plate 12, a photovoltaic cell SC and resin material 11a for sealing it therein (sealing resin material) are interposed between the face plate 12 and back plane member 10 as schematically drawn in FIG. 4c, and a heat press process may be performed in which the face plate 12 and the back plane member 10 are pressurized from the opposite sides toward each other while being heated to the cross-linking temperature of the sealing resin material, similarly in a conventional process. In this heat press process, as in FIG. 4d, the assembly in which the photovoltaic cell SC and the sealing resin material 11a are clamped by the face plate 12 and the back plane member 10 therebetween is placed on a hot plate HP of a laminator device, and then, the hot plate HP is heated to a set temperature (typically, 135° C.-150° C.) under vacuum so that the temperature of the sealing resin material will exceed beyond its cross-linking temperature while the process of pressurizing between the face plate 12 and the back plane members 10 is performed at an appropriately adjusted pressure Pr (for example, 50-100 kPa) in an appropriately adjusted term (for example, 10 to 30 minutes) as illustrated. Then, the sealing resin material 11a melts to enclose the photovoltaic cell SC therein while a cross-linking reaction occurs within the resin material so that it will be molded into a layer structure and cured, forming the sealing material layer 11 (The sealing material layer 11 is adhered also on the interfaces of the face plate 12 and the back plane member 10.). Thus, a photovoltaic cell module will be formed as shown in FIG. 1A (After that, the first-mentioned film-like substrate fl may be removed off from the hard coat layer.).

By the way, in the research and development by the inventors of the present disclosure, it has been found that, in carrying out the above-mentioned heat press process for the face plate 12 on which the decorative layer 14 has been laminated, if resin whose softening temperature is comparatively low is used as the resin for the base material of the decorative layer 14, uneven structures are formed on the decorative layer 14 during the heat press process and thus the uniformity of the appearance of the completed photovoltaic cell module becomes remarkably deteriorated (see the experimental examples mentioned below and FIGS. 6A-6C). It is considered that this phenomenon is because, in the decorative layer 14 comprising the scaly glitter pigment dispersed in the base material, the base material resin is melted or softened to fluidly deform while leaving the scaly glitter pigment particles as they are during the heat press process. On the other hand, when resin which maintained a layer structure during the heat press process was employed as the base material of the decorative layer 14, a photovoltaic cell module having a uniform appearance was formed. More concretely, in the above-mentioned heat press process, since the temperature of the decorative layer 14 is about 5WC lower than the set temperature of the hot plate, the resin which is not softened at a temperature about 5° C. lower than the set temperature of the hot plate (whose softening temperature is higher than ([the set temperature of the hot plate]-5° C.) is used as the resin of the base material of the decorative layer 14. Thus, for the transparent resin to be used as the base material of the decorative layer, a resin which maintains a layer structure in the heat press process for enclosing a photovoltaic cell in a sealing material layer may be chosen. Concretely, for such a resin, urethane resin whose softening temperature is higher than a temperature reaching in a decorative layer during the heat press process (around a cross-linking temperature of sealing resin material or higher), for example, EMS-03 clear (NIPPON PAINT AUTOMOTIVE COATINGS CO., LTD.), etc., is usable.

Alternatively, the decorative layer may be applied and cured on the face plate in the above-mentioned manner after forming the photovoltaic cell module to the face plate, and the hard coat layer may be formed on it. It should be understood that such a case also belongs to the scope of the present embodiment.

Experimental Examples

In accordance with the teaching of the above-mentioned present embodiment, photovoltaic cell modules were prepared, and the designabilities in the appearances and the power generation abilities of the photovoltaic cell modules were verified. In this regard, it should be understood that the following experimental examples illustrate the validity of this embodiment, and the scope of the present embodiments are not limited thereto.

In experiments, first, after a hard coat layer and a decorative layer were laminated on a film-like substrate in the above-mentioned manner, the decorative layer was laminated and adhered on a face plate made of a polycarbonate plate with a heat rubber roll heated at 160° C. Then, an assembly in which a single crystal silicon cell and ethylene vinyl acetate were used as a photovoltaic cell and sealing material, respectively, and these were sandwiched between the face plate, on which a hard coat layer and a decorative layer were laminated, and a back plane member, made of black polyethylene terephthalate (Both the photovoltaic cell and the back plane member were black.), was placed on a laminator device and a heat press process was performed in the above-mentioned manner. In the heat press process, in more detail, a degassing process was carried out for 15 minutes under a condition that the hot plate temperature was set to 135° C. for establishing a vacuum condition, and then, the hot plate temperature was set to 140° C. and the pressurization was performed for 20 minutes. In this regard, in the resin solution of the decorative layer before curing, there was employed, as the base material of the decorative layer, an urethane resin whose softening temperature is higher than the temperature of the decorative layer during the heat press process so that its layer structure can be maintained during the heat press process (The molecular weight: 50000; the softening temperature: 147° C.; EMS-03 clear base, obtained from NIPPON PAINT AUTOMOTIVE COATINGS CO., LTD.), and the light transmissive scaly glitter pigment was dispersed at 3 weight % to 40 weight %. For the hard coat layer, urethane acrylate resin, which is active energy ray curable type coating composite (EJS-08 clear, NIPPON PAINT AUTOMOTIVE COATINGS CO., LTD.), was used. For comparison, there were prepared a control sample in which an urethane resin whose softening temperature is lower than the temperature of the decorative layer during the heat press process so that a layer structure cannot be maintained during the heat press process (The molecular weight: 46000; the softening temperature: 88° C.; EMS-02 clear, obtained from NIPPON PAINT AUTOMOTIVE COATINGS CO., LTD.) and control examples using non-light transmissive pigments as pigments dispersed in decorative layers.

In evaluating characteristics of prepared photovoltaic cell modules, with respect the power generation output of a photovoltaic cell module, a sample of a photovoltaic cell module was irradiated with light from a solar simulator (The irradiation condition of the solar simulator was set so as to be at 1 kW/m$^2$ and satisfy the spectral coincidence of JIS C 8912 class A.), and its power generation output (W) was measured with IV curve tracer MP-160 (Eikoh Seiki). Further, the appearance of a photovoltaic cell module was evaluated as follows: (1) With respect to an unnatural change of color depending upon a viewing angle of the surface of a photovoltaic cell module, the change of color of a sample was checked by human eye observation while the sample was being inclined continuously from the position that its surface normally faced to the observer (set as 0 degree) to 80 degrees therefrom under an indoor fluorescent light. (2) Whether or not the color looks uniform on the whole area region of a photovoltaic cell module surface (The uniformity of color on the surface) was evaluated by human eye observation and by the measurement with a colorimeter (Konica Minolta cm512m-3a). In the colorimeter, with respect to one same photovoltaic cell module sample, by irradiating two points on which the respective colors looked the most different from each other by eye observation (a region occupied by a photovoltaic cell and the other region) with light incident at the respective angles of 25°, 450 and 75° from the normal direction of the surface of the sample, as schematically drawn in FIG. 5, using a D65 light source, the corresponding color values L*a*b* of the reflected light at the normal direction of the surface of the sample were measured and the color difference values ΔE (ΔL*a*b*) between the above-mentioned two points were computed, respectively.

In the results, first, when the resin (EMS-02 clear) whose softening temperature was comparatively low so that a layer structure could not be maintained during the heat press process was used as the base material resin of the decorative layer, uneven structures were formed in the decorative layer after the heat press process as shown in FIGS. 6B and 6C, and the appearance of the photovoltaic cell module did not look uniform. On the other hand, when the resin (EMS-03 clear) whose softening temperature was comparatively high so that a layer structure could be maintained during the heat press process was used as the base material resin of the decorative layer, the decorative layer maintained a uniform layer structure as shown in FIG. 6A and the appearance of the photovoltaic cell module was almost uniform. Thus, it has been shown that, by using the resin which maintains a layer structure during the heat press process as the base material resin of a decorative layer, a photovoltaic cell module with a uniform appearance is formed.

Next, referring to FIG. 7, in the measurements of the power generation outputs in photovoltaic cell modules whose decorative layers were formed using resin solutions in which, as the light transmissive scaly glitter pigment, blue alumina flake pigment (The size in the surface direction was about 20 μm and the thickness was about 0.3-1 μm. Blue XIRALLIC® T60-23WNT GALAXY (Merck)) was dispersed at 3 weight % to 30 weight % (the concentration before curing), respectively, the ratios (♦) of the power generation outputs to that in the case of the decorative layer containing no pigments were about 98% to about 60% (The power generation output ratio declined generally in proportion to the increase of the pigment concentration.). Further, in the measurements of the power generation outputs in photovoltaic cell modules whose decorative layers were formed using resin solution in which, as the light transmissive scaly glitter pigment, green interference glass flake pigment (The size in the surface direction was about 20 μm and the thickness was about 0.5-5 μm. Metashine® GT1020RG-J3 (Nippon Sheet Glass Co., Ltd) was dispersed at 10 weight % to 40 weight % (the concentration before curing), respectively, the ratios (○) of the power generation outputs to that in the case of the decorative layer containing no pigments were about 97% to about 79%. Accordingly, it has been shown that, by using a light transmissive scaly glitter pigment as the pigment for a decorative layer at its concentration of less than 40 weight %, about 60% or more of the power generation outputs in the case where no pigment is contained in the decorative layer can be maintained.

Then, the results of evaluating the appearances of the above-mentioned photovoltaic cell modules in which blue alumina flake pigment was used as the light transmissive scaly glitter pigment are as follows:

TABLE 1

| Pigment weight concentration | Unnatural feeling to color change | In-plane color uniformity | ΔE@25° | ΔE@45° | ΔE@75° |
|---|---|---|---|---|---|
| 3% | none | Δ | 1.969797 | 2.353551 | 3.204005 |
| 5% | none | Δ | 3.360331 | 2.753461 | 2.86001 |
| 10% | none | ○ | 0.895517 | 1.370338 | 1.6164 |
| 20% | none | ○ | 0.58579 | 0.828764 | 0.754868 |
| 30% | none | ○ | 0.187083 | 1.1978 | 1.350333 |

In the table shown above, that "Unnatural feeling to color change" is "none" indicates a case in which, when a sample is observed by eye while being inclined as noted above, its color change was hardly visually recognized. In "In-plane color uniformity", Δ indicates a condition that, while a little difference between a site occupied by a photovoltaic cell and a site not occupied by a photovoltaic cell on a sample was visually recognized when the sample was observed by eye at a position close thereto (less than 30 cm), the color of the whole region looked uniform when the sample was observed at 30 cm apart therefrom; and ○ indicates a condition that the color of the whole region looked uniform when the sample was observed by eye at both positions close thereto and apart therefrom. ΔE@25°, ΔE@45° and ΔE@75° each are a color difference value (ΔL*a*b*) between a site occupied by a photovoltaic cell and a site not occupied by a photovoltaic cell on a sample when irradiated with light incident at angles of 25°, 45° and 75° from the normal direction of the surface of the sample, where, if the color difference value is lower than 3, it is at a level that the difference can hardly be recognized by human eye. Accordingly, with reference to Table 1, it can be judged that, when the weight concentration of the scaly glitter pigment in a resin solution before curing is 3 weight % or more, no color change depending upon a viewing angle is observed; and when the weight concentration of the scaly glitter pigment is 3 weight % or more and in some embodiments 10 weight % or more, the difference between a site occupied by a photovoltaic cell and a site not occupied by a photovoltaic cell is hardly visually recognized and also the color difference value is less than 3 in almost all cases, so that the difference in color between a photovoltaic cell and the other portion is made almost disappear.

According to the above-mentioned results, it has been shown that, by dispersing light transmissive scaly glitter pigment in a decorative layer of a photovoltaic cell module, especially, by dispersing in the decorative layer such scaly glitter pigment in the range of 3 weight % to 40 weight %, and in some embodiments in the range of 10 weight % to 30 weight %, in a resin solution before curing, the difference in color between a photovoltaic cell and the other portion can be made almost disappear, and also the changes of the color and appearance of the surface of the module depending upon a viewing angle can be made hardly visually recognized, while the power generation output of the photovoltaic cell module is maintained at a level higher than about 60% of the case that no pigment is contained in the decorative layer.

Furthermore, there were verified characteristics of photovoltaic cell modules to which decorative layers with light transmissive scaly glitter pigments of different colors were applied. In this connection, the content of the scaly glitter pigment dispersed in the decorative layer was set at 10 weight % in the resin solution before curing in all cases. FIGS. 8a-8c show the photographs in plan view of examples of actually prepared photovoltaic cell modules. In the examples shown here, although each photovoltaic cell is positioned on the almost center of the corresponding image, it will be understood that its contour is hardly visually recognized while its appearance is almost uniform.

The measurement results of the power generation outputs of the above-mentioned photovoltaic cell modules to which decorative layers with various scaly glitter pigments being dispersed were applied are described below. Here, a power generation output ratio is a ratio of the power generation output of each sample to the power generation output in the case that no pigment was used in the decorative layer. The color of each scaly glitter pigment shows the color of the appearance of each photovoltaic cell module. In this regard, for comparison, the results of examples using non-light transmissive pigments are also shown (The pigment weight concentration before curing of the decorative layer was 10 weight % in all cases.).

TABLE 2

| Series | Color | Product Name | Power generation output ratio |
|---|---|---|---|
| Interference alumina flakes | Silver | T60-10 | 83.0% |
| Size in surface direction: ~20 μm | Gold | T60-20 | 78.6% |
| Thickness: 0.1-1 μm | Red | T60-21 | 90.0% |
|  | Lilac | T60-22 | 92.1% |
|  | Blue | T60-23 | 92.0% |
|  | Green | T60-24 | 92.0% |
| Glass flake | Silver | GT1020RSJ3 | 91.2% |
| Size in surface direction: ~20 μm | Blue | GT1020RBJ3 | 96.0% |
| Thickness: 0.1-1 μm | Green | GT1020RGJ3 | 96.3% |
|  | Gold | GT1020RYJ3 | 90.1% |
|  | Red | GT1020RRJ3 | 94.8% |
| Large size glass flake | Gold | 5420 | 91.9% |
| Size in surface direction: ~200 μm | Red | 5422 | 93.1% |
| Thickness: 0.5-10 μm | Blue | 5424 | 92.3% |
| Comparison sample: Silica colored | Red | F-20-51 | 55% |
| Comparison sample: unknown colored | Orange | M40-58 | 61% |
| Comparison sample: | Red | F121-51 | 71% |
| Aluminum colored | Orange | F120-58 | 62% |

Pigment product name:
T60-10:XIRALLIC® T60-10 WNT CRYSTAL SILVER (Merck)
T60-20:XIRALLIC® T60-20 WNT SUNBEAM GOLD (Merck)

T60-21:XIRALLIC® T60-21 WNT SOLARIS RED (Merck)
T60-22:XIRALLIC® T60-22 WNT AMETHYST DREAM (Merck)
T60-23:XIRALLIC® T60-23 WNT GALAXY BLUE (Merck)
T60-24:XIRALLIC® T60-24 WNT STELLAR (Merck)
GT1020RSJ3, GT1020RBJ3, GT1020RGJ3, GT1020RYJ3, GT1020RRJ3: Meta-Shine (Nippon Sheet Glass Co., Ltd.)
5420: Miraval® 5420 Magic Gold (Merck)
5422: Miraval® 5422 Magic Red (Merck)
5424: Miraval® 5424 Magic Blue (Merck)
F-20-51: Merck Co. COLORSTREAM® F20-51 SW LAVA RED (Merck)
M40-58: Merck Co. Pyrisma® M40-58 Ambercup Orange (Merck)
F121-51: Merck Co. Meoxal® F121-51 Atacama Red (Merck)
F120-58: Merck Co. Meoxal® F120-58 Wahiba Orange (Merck)

Referring to the results in Table 2, it is understood that the power generation output ratios exceeded beyond 90% in most cases that the content of the light transmissive scaly glitter pigment was 10 weight % in the resin solution before curing. On the other hand, it is understood that, when non-light transmissive pigment was used (comparison samples), the power generation output ratios decreased as compared with the cases that the light transmissive scaly glitter pigments were used. In this regard, in the tests by eye observation, "Unnatural feeling to color change" was "none" and "In-plane color uniformity" was ○ in all the samples in Table 2. Thus, in accordance with above-mentioned results, it has been shown that, by using various light transmissive scaly glitter pigments, a photovoltaic cell module can be variously colored while the power generation output ratio to the case that no pigment is contained can be maintained at a very high level as compared with cases that non-light transmissive pigment is used, namely, the reduction of the power generation amount of the photovoltaic cell due to the addition of a decorative layer can be suppressed at a small level.

Further, the light transmission characteristics of the decorative layers in which the above-mentioned various light transmissive scaly glitter pigments were dispersed were as shown in FIGS. 9A and 9B. As understood with reference to the drawing, in the decorative layers with the light transmissive scaly glitter pigment being dispersed, each total light transmittances became a value higher than about 50% or more in the large area ranging from the visible light region to the infrared region.

Moreover, it has been found that the average values of the total light transmittances of the decorative layers containing the various light transmissive scaly glitter pigments used above in the wavelength range of 450 nm-900 nm are correlated with the power generation output ratios as shown in FIG. 10. As understood from the drawing, when the average value of the total light transmittance is more than about 50% or more, the power generation output ratio exceeding about 60% is achieved; when the average value of the total light transmittance is more than about 60% or more, the power generation output ratio exceeding about 75% is achieved; and when the average value of the total light transmittance is 70%-85%, the power generation output ratio exceeding about 80% is achieved (When no pigment is contained in the decorative layer, the average value of the total light transmittance is about 90%.). Namely, it has been shown that, by adjusting the kind and content of light transmissive scaly glitter pigment in a decorative layer so that the average value of the total light transmittance in the wavelength range of 450 nm-900 nm in the decorative layer will be about 50% or more, in some embodiments about 60% or more, and in other embodiments 70%-85%, it become possible to form a photovoltaic cell module which is variously colored without occurring unnatural feeling of the color change and has in-plane uniformity and also has the power generation output ratio exceeding about 60%, about 75% or about 80%.

Thus, according to the above-mentioned series of the experimental examples, it is understood that, by applying to a photovoltaic cell module a decorative layer in which scaly glitter pigment is dispersed such that pigment particles are oriented in almost parallel to the surface of a face plate as noted above, it is possible to provide the photovoltaic cell module with the designability where the difference in color between the photovoltaic cell and the other portions under the face plate is made to disappear and the color change on the surface depending upon a viewing angle is hardly visually recognized, while suppressing low the reduction of the power generation amount of the photovoltaic cell due to the addition of the decorative layer.

Although the above explanation has been described with respect to embodiments of the present disclosure, it will be apparent for those skilled in the art that various modifications and changes are possible, and that the present disclosure is not limited to the above-illustrated embodiments and may be applied to various devices and apparatus without deviating from the concepts of the present disclosure.

The invention claimed is:

1. A method of forming a photovoltaic cell module including a thin plate-like photovoltaic cell enclosed in a transparent sealing material, a transparent face plate laminated and adhered directly to a surface of the transparent sealing material on a light receiving surface of the photovoltaic cell, and a decorative layer laminated and adhered on the transparent face plate, the method comprising:
    laminating and adhering the decorative layer on the transparent face plate; and
    enclosing the photovoltaic cell in the transparent sealing material between the transparent face plate and a back plane member by a heat press process,
    wherein a transparent resin is employed as base material of the decorative layer and a scaly glitter pigment having a light transmissive property is dispersed in the decorative layer such that a surface direction of the scaly glitter pigment is oriented along a surface of the face plate, a length of the surface direction is greater than a length of a thickness of the scaly glitter pigment,
    wherein a length of a surface direction of the scaly glitter pigment is 5-300 μm and a length of a thickness of the scaly glitter pigment is 0.1-10 μm,
    wherein a content of the scaly glitter pigment in the decorative layer before a curing of the decorative layer is from 3 weight % to 40 weight %,
    wherein the transparent resin used as the base material of the decorative layer is a resin configured to maintain a layer structure with the scaly glitter pigments being dispersed at the content therein during the heat press process for enclosing the photovoltaic cell in the sealing material.

2. The method of claim 1, wherein the scaly glitter pigment is at least one of interference alumina flake, interference mica flake, interference glass flake, interference silica flake, and interference talc flake.

3. The method of claim 1, wherein the decorative layer is a film having a thickness of 3-70 μm.

4. The method of claim 1, wherein the transparent resin used as the base material of the decorative layer is a resin capable of maintaining a softening temperature higher than a temperature of the decorative layer during the heat press process.

5. The method of claim 1, wherein a transparent hard coat layer made of an active energy ray curable type coating composite is laminated on the decorative layer.

6. The method of claim 1, wherein the back plane member exhibiting a substantially same color as the light receiving surface of the photovoltaic cell is laminated on a surface of the sealing material on a side opposite to the light receiving surface of the photovoltaic cell.

7. The method of claim 1, wherein the black back plane member is laminated on a surface of the sealing material on a side opposite to the light receiving surface of the photovoltaic cell.

8. The method of claim 1, wherein a transparent back plane member is laminated on a surface of the sealing material on a side opposite to the light receiving surface of the photovoltaic cell and the module is placed on an installation mount exhibiting a substantially same color as the light receiving surface of the photovoltaic cell or black such that the transparent back plane member is attached on the installation mount.

9. The method of claim 1, wherein the back plane member of a color different from a color of the light receiving surface of the photovoltaic cell is laminated on a surface of the sealing material on a side opposite to the light receiving surface of the photovoltaic cell.

10. The method of claim 1, wherein a film layer exhibiting a substantially same color as that of the light receiving surface of the photovoltaic cell is interposed between a back surface of the photovoltaic cell opposite to the light receiving surface of the photovoltaic cell and the surface of the sealing material.

11. The method of claim 1, wherein a printed layer in which an arbitrary pattern can be printed is laminated on the decorative layer.

12. The method of claim 1, wherein an average value of a total light transmittance in a wavelength range from 450 nm to 900 nm of the decorative layer is 50%-85%.

* * * * *